United States Patent
Kostic et al.

Patent Number: 5,648,983
Date of Patent: Jul. 15, 1997

[54] CDMA RAKE RECEIVER WITH SUB-CHIP RESOLUTION

[75] Inventors: Zoran Kostic; Gordana Pavlovic, both of Tinton Falls, N.J.

[73] Assignee: Lucent Technologies Inc., Murray Hill, N.J.

[21] Appl. No.: 427,519

[22] Filed: Apr. 24, 1995

[51] Int. Cl.$^6$ ........................................... H04B 1/707
[52] U.S. Cl. ........................................... 375/206; 375/349
[58] Field of Search ........................................... 375/200, 206, 375/349

[56] References Cited

U.S. PATENT DOCUMENTS 5,377,226  12/1994  Davis ........................................... 375/206
5,448,590  9/1995  Kostic ........................................... 375/232

OTHER PUBLICATIONS

Z. Kostic, M.I. Sezan and E.L.Titlebaum, "Estimation of the Parameters of a Multipath Channel Using Set-Theoretic Deconvolution," IEEE Transactions on Communications, vol. 40, No. 6, Jun. 1992, pp. 1006-1011.

J.G. Proakis, Digital Communications. New York: McGraw-Hill Book Company, 1989, pp. 728-739.

Primary Examiner—Stephen Chin
Assistant Examiner—Jeffrey W. Gluck

[57] ABSTRACT

A rake receiver for use in direct-sequence code-division multiple-access communication systems employs a novel channel estimator capable of resolving multipath components spaced closer than a chip interval of the direct-sequence signature sequence. The estimator utilizes a constrained iterative deconvolution technique which employs projection onto convex sets (POCS). In a matched filter rake receiver embodiment, the delay $T_{SC}$ between two taps of a delay line is smaller than the duration $T_C$ of a chip of pseudo-random sequence. A rake receiver constructed in this manner is capable of detecting signals that have propagated through multipath channels and that have path components spaced closer than one chip of the signal sequence (i.e. closer than the inverse of the signal bandwidth).

5 Claims, 3 Drawing Sheets

CDMA RAKE RECEIVER WITH SUB-CHIP RESOLUTION

BACKGROUND OF THE INVENTION

1. Field of the Invention

The present invention relates generally to systems and methods for receiving spread spectrum radio signals, such for example as digitally modulated signals in a Code Division Multiple Access (CDMA) communication system, propagating through a multipath environment and, more particularly, to a rake receiver scheme for such signals.

2. Description of the Related Art

Direct Sequence Spread Spectrum (DSSS) systems, such as Direct Sequence Code Division Multiple Access (DS-CDMA) systems, are attracting widespread attention in the personal communication fields such, for example, as digital cellular radio. In a DS-CDMA communication system, both the time and frequency domains may be shared by all users simultaneously. As such, a base station may simultaneously transmit distinct information signals to separate users using a single band of frequencies. Individual information signals simultaneously transmitted may be isolated by each receiving user because of the base station's utilization of unique signature sequences in the transmission of the information signals. Prior to transmission, the base station multiplies each information signal by a signature sequence signal assigned to the user intended to receive the signal. A signature sequence consists of a number of chips. By multiplying an information signal with a signature sequence, the rate of transmissions through the channel increases from the bit rate to the chip rate. To recover a transmitted signal from among those signals transmitted simultaneously in a frequency band, a receiving mobile user multiplies a received signal (containing all transmitted signals) by its own unique signature sequence signal and integrates the result. In so doing, the user identifies that signal intended for it, as distinct from other signals intended for other users.

In wireless communication systems (such as DS-CDMA systems), an information signal is communicated from a transmitter to a receiver via a channel comprising several independent paths. These paths are referred to as multipaths. Each multipath represents a distinct route that an information signal may take in traveling between transmitter and receiver. An information signal communicated via such routes or multipaths appears at a receiver as a plurality of multipath signals, one for each multipath. When multipath time dispersion is present in a CDMA system, the receiver receives a composite signal of multiple versions of the transmitted symbol that have propagated along different paths (referred to as "rays"), some of which may have relative time delays of less than one chip. Because of complex addition of multipath signals, the strength of received signals may vary between very small and moderately large values. The phenomenon of received signal strength variation due to complex addition of multipath signals is known as fading.

Among the techniques used to mitigate the effects of fading in DS-CDMA communication systems is the path diversity technique. Path diversity in DS-CDMA systems entails estimation of the delay introduced by each of one or more multipaths (in comparison with some reference, such as line-of-sight delay), and then using this delay in a receiver structure to separate (or resolve) the received multipath signals. A receiver structure often employed to provide path diversity is the so-called rake receiver, which is well known in the art. See, e.g., R. Price and P. E. Green, Jr., *A Communication Technique for Multipath Channels*, 46 Proc. Inst. Rad. Eng. 555–70 (March 1958).

In a rake receiver employing a conventional correlation-based channel estimator, correlation values of the signature sequence with the received signals at different time delays are passed through a delay line that is tapped at the expected time delay (dt), i.e., the expected time between receiving echoes. The outputs at the rake taps are then combined with appropriate weights to form the rake receiver output. Such a receiver searches for the earliest ray by placing a tap at $T_o$, and for a ray delayed by dt by placing a tap at $T_o+dt$, and so forth. The number of taps depends upon the channel delay spread and is less than or equal to the number obtained by dividing the channel delay spread by the chip period. The rake tap outputs having significant energy are appropriately weighted and combined to maximize the received signal-to-noise-and-interference ratio. The total time delay of the delay line determines the amount of arrival time delay that can be searched. In addition, the accuracy of the channel estimator can only be improved by increasing the bandwidth of the transmitted signal.

Thus, while the path diversity afforded by conventional rake receivers is beneficial in many instances, it may not provide a significant diversity benefit where the range of multipath delay values in these environments is small compared with the duration of a DS-CDMA chip interval (which may be, for example, 1 μs). Because of this, knowledge of delay values obtained by a conventional correlation-based channel estimator alone is insufficient to allow resolution of multipath signals.

SUMMARY OF THE INVENTION

In accordance with the present invention, an improved rake receiver employs a novel channel estimator having sub-chip resolution. The improved rake receiver is capable of detecting signals that have propagated through multipath channels and that have path components spaced closer than one chip of the signal sequence (e.g. closer than the inverse of the signal bandwidth). The improved rake receiver may utilize either a matched filter or a correlation receiver configuration. Illustrations and examples presented herein are shown, by way of nonliminted example, for correlation receiver implementations of the receiver.

A receiver constructed in accordance with an illustrative embodiment of the present invention includes a channel estimation module which estimates multipath components (i.e. multipath delay position and amplitude values) using a set-theoretic, constrained iterative deconvolution technique called Projection Onto Convex Sets (POCS). In POCS, constraints are defined on the basis of a priori information about the noise statistics and the actual signal. For each constraint so defined, a closed convex constraint set is established such that the members of the set satisfy the given constraint and the actual signal (ideal solution) is a member of the set. A solution to the problem is defined to be any member of the intersection set, i.e. any feasible solution satisfying all of the constraints.

In a matched filter rake receiver embodiment of the present invention, a novel POCS constraint is derived to exploit the noise covariance modified by a matched filter at the front-end of the receiver. Because the channel estimator provides sub-chip resolution, substantial improvements in accuracy over conventional rake receivers are achieved by increasing the number of taps above one per chip period. That is, the inventive receiver may be configured to utilize a sampling rate which exceeds one sample per chip. As such, the accuracy of the channel estimator is limited only by the chosen sampling rate of the receiver.

The receiver of the present invention can be used to minimize the influence of multipath channels with closely spaced path components regardless of the channel medium. The inventive receiver system is particularly useful for wireless CDMA communication systems such, for example, as cellular and cordless communication systems.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. For example, the drawings illustrate the correlation receiver implementation of the receiver, whereas a person skilled in the art will easily generate a matched filter receiver implementation of the method herein disclosed.

BRIEF DESCRIPTION OF THE DRAWINGS

In the drawings, wherein like reference characters denote similar elements throughout the several views.

DETAILED DESCRIPTION OF THE INVENTION

1. Overview of the Present Invention

Figure 1:
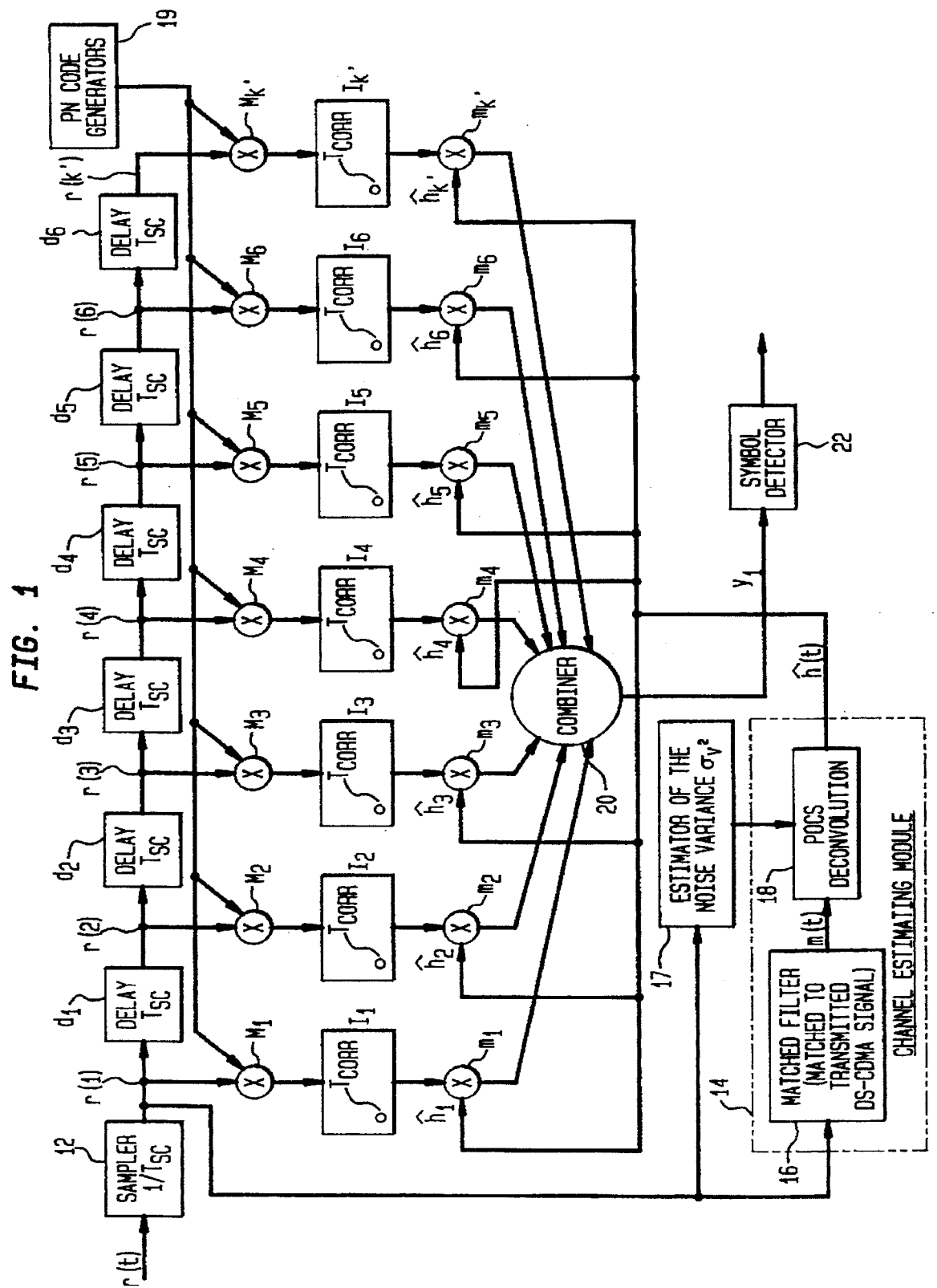
FIG. 1 depicts a rake receiver utilizing a POCS-based channel estimation technique and constructed in accordance with an illustrative embodiment of the present invention.

The present invention is directed to a direct sequence spread spectrum receiver having sub-chip resolution for use with CDMA (Code-Division-Multiple Access) cellular and cordless telephone applications, although the spread spectrum receiver of the present invention may also be adapted for use with other types of communication applications. The spread spectrum receiver of the present invention implements rake diversity combining based on sub-chip resolution estimates by using a novel adaptation of POCS (Projection Onto Convex Sets) as described in further detail hereinbelow.

2. Description of the Signal Received by the Spread Spectrum Receiver

The complex analog signal which is transmitted to and received by the spread spectrum receiver of the present invention is described in this section. The manner in which this complex analog signal is generated and transmitted to the spread spectrum receiver is also described in this section.

Spread spectrum communication is described in many publicly available documents and texts such as *Digital Communications* by Proakis (McGraw Hill, 1989) and *Spread-Spectrum Communications* by Simon et al. (Computer Science Press, 1989). As is well known, spread spectrum communication signals used for the transmission of digital information are characterized by their large bandwidth W, which is much greater than the information rate R in bits per second. Thus, the bandwidth expansion factor L=W/R for a spread spectrum signal is much greater than unity. The large redundancy inherent in these signals is required to overcome the severe levels of interference that are encountered in the transmission of digital information over some radio and satellite channels. In addition, the pseudo-random structure of the signals makes them appear similar to random noise and difficult to demodulate by receivers other than the intended ones.

Direct-sequence spread spectrum (DS-SS) modulation is also generally well known. In DS-SS, a carrier is modulated first by a pseudo-random waveform, also called a pseudo noise (PN) waveform, before modulation by a data stream. The PN waveform consists of a sequence of bits (called chips), each of duration $T_c < T_b$ (where $T_c$ denotes the period of one chip and $T_b$ the period of one symbol, or baud. Usually, one bit period contains up to several hundred chips. The transmitted direct-sequence spread spectrum signal s(t) can be written as $$s(t) = \sqrt{\frac{E_s}{T_b}} \, d(t) c(t) e^{j(\omega_0 t + \phi)}$$

where $$d(t) = \Sigma d_k p_I(t - kT_b)$$

and $$c(t) = \sum_l c_k p_2(t - kT_b - lT_c)$$

and where $\omega_o$ denotes the carrier frequency, $E_s$ is the signal energy, $d_k$ represent delay elements of a shift register and $c_k$ is a +/−1 valued, L-chip long spreading (PN) code with chip time $T_c = T_b/L$ seconds. The original data spectrum is thus spread out in frequency by a factor of L, resulting in a spread spectrum signal. The process of multiplying the transmitted data by the PN code is conventionally called spreading the signal. The waveforms $p_1(t)$ and $p_2(t)$ are a rectangular pulse waveform and a chip pulse-shaping waveform, respectively.

The signal passes through a fading multipath channel which is described in many publicly available documents, such as *Introduction to Spread Spectrum Antimultipath Techniques and Their Applications to Urban Digital Radio* by Turin, 68 Proc. IEEE 328–53 (1980), which is incorporated herein by reference. The complex analog signal is received by the spread spectrum receiver of the present invention and demodulated to produce an analog signal r(t), as will next be described.

3. Structure and Operation of the Spread Spectrum Receiver

The structure and operation of the spread spectrum receiver of the present invention shall now be described in detail with reference to the illustrative rake receiver structure 10 depicted in FIG. 1. Rake communication systems and components are generally well known, and are described in many publicly available documents such as *Introduction to Spread Spectrum Antimultipath Techniques and Their*

*Applications to Urban Digital Radio* by Turin, referenced hereinabove. Although the rake receiver 10 of the present invention is configured in a manner similar to conventional rake receivers, the inventive receiver differs in that the sample rate exceeds the chip rate in order to facilitate sub-chip resolution of closely spaced multipath components in accordance with a novel technique to be hereinbelow described. By way of particular example, in a conventional rake receiver having a chip rate of $T_c$ and a maximum delay spread of $T_d$, k samples are typically taken in each frame, where $k=T_d/T_c$. In accordance with the present invention, however, sampling device 12 samples received signal r(t) at a rate $T_{sc}$, which rate may be substantially higher than the chip rate so that a total of k' samples are taken per symbol, where k' is a number greater than k. Thus, in the illustrative embodiment of FIG. 1, the samples are denoted by the set r(1), r(2), r(3), r(4), r(5), r(6) and r(k'). In order to have access to all k' samples for demodulation purposes, the samples are stored in a shift register comprising k'−1 elements $d_1$- $d_{k'-1}$, wherein each delay element provides a delay of $T_{sc}$ seconds between its inputs and outputs.

With continued reference to FIG. 1, the rake receiver 10 of the present invention includes a channel estimating module 14 having a filter 16 matched to the transmitted sequence waveform. The filtered output of matched filter 16 is supplied to POCS deconvolution module 18, the operation of which module will be described in detail hereinbelow. Rake receiver 10 further includes a noise estimator module 17 for estimating the noise variance $o^2$ in the sampled signal. For a purpose which will soon be explained, the estimated noise variance is supplied to POCS deconvolution module 18.

The principle underlying the improved rake receiver 10 is weighting of the multipath signal components, including sub-chip components, before combining in order to maximize the signal-to-noise ratio of the output statistic. For this purpose, channel estimating module 14 implements a novel POCS-based (Projection Onto Convex Sets) deconvolution process to estimate a weighting coefficient ĥ for each component. Each of samples r(1) through r(k') is initially multiplied, using multipliers $M_1$ through $M_{k'}$, by the output of a PN code generator 19 which generates the appropriate pseudo-noise code, to thereby create high peaks in the autocorrelation function. The product of each such multiplication is then integrated at respective integrators $I_1$ through $I_{k'}$. This preprocessing of the samples r(1) through r(k') defines, as is well known in the art, a correlation receiver for each component of the signal. Next, the outputs of the integrators $I_1$ through $I_{k'}$ are multiplied, utilizing multipliers $m_1$ through $m_{k'}$, with a corresponding one of the estimated coefficients ĥ(1) through ĥ(k'), and the respective output products are summed by a combiner 20. The output of combiner 20 is sampled by a sampling device (not shown) at the symbol rate $1/T_b$ to produce the output $y_1$. If appropriate, the output of combiner 20 can be processed by hard or soft channel decoder (not shown) prior to bit detection. As shown in FIG. 1, $y_1$ is processed by a conventional threshold detector 22 to yield a bit decision corresponding to the estimate of the transmitted information bit.

4. Channel Estimation

The manner in which channel estimation module 14 derives coefficients for use in resolving sub-chip multipath components in accordance with the present invention will now be described.

A. Matched Filtering Of The Channel Estimator (Matched To The Transmitted Sequence Waveform)

The output m(t) of the matched filter can be expressed as the convolution of the autocorrelation function a(t) of the DS-CDMA probing signal with the channel response, i.e.

$$m(t)=s(-t)\otimes s(t)\otimes h(t)+s(-t)\otimes n(t)=a(t)\otimes h(t)+v(t)$$

where $v(t)\equiv s(-t)\otimes n(t)$ denotes the noise at the matched filter output. As probing signals in DS-CDMA systems, m-sequences BPSK modulated on a carrier are used. An analytical expression for the direct-sequence CDMA signal is given by $$s(t) = s(a_i,t) = \sqrt{2P}\ \cos(\omega_c t+\Phi) \sum_{l=0}^{L-1} a_{i,l}pT_c(t-iT_b-lT_c)$$

where $T_c$ is the chip duration, $T_b=LT_c$ is the signaling interval, $\Phi$ is random phase, $\omega_c$ represents the carrier frequency, P represents the signal power, L is the sequence length, $pT_c$ is the rectangular pulse of duration $T_c$, and $a_{i,l}$ corresponds to a particular DS-CDMA chip in a sequence $a_i$.

Autocorrelation sequences of such signals have a narrow main lobe and low side lobes. As will hereinafter become apparent, these properties are beneficial for the subsequent deconvolution performed by POCS. Specifically, since the probing signal autocorrelation function is a priori known, it is now possible to deconvolve the output of the matched filter to estimate the channel response with high resolution (using the inventive technique) and, hence, to obtain the multipath parameters with sub-chip resolution.

B. Set-Theoretic Deconvolution

The task of the deconvolution stage is to deconvolve m(t) and obtain a good (i.e. high resolution) estimate ĥ(t) of the channel impulse response. The deconvolution is implemented using a set-theoretic method—the method of Projection Onto Convex Sets (POCS). The POCS deconvolution is regularized and its noise sensitivity is considerably smaller than that of other techniques. In POCS deconvolution, constraints are defined on the basis of a priori information about the noise statistics and the actual signal. For each constraint, a closed convex constraint is defined such that the members of the set satisfy the given constraint and the actual signal (ideal solution) is a member of the set. A solution to the problem is defined to be any member of the intersection of the set, i.e. a feasible solution satisfying all of the constraints. A feasible solution is found by successively projecting an initial estimate onto the constraint sets. For an extensive discussion of the POCS technique and some of its application, reference may be made to the text *Image Recovery* by H. Stark (Academic Press, 1986), which is incorporated herein by reference.

The deconvolution problem is formulated in the discrete-time domain where the matched filter output m(t) is expressed in terms of a circulant vector matrix equation in $R^K$ (K-dimensional Euclidean space), i.e. m=Ah+v. Vectors m, h, and v are formed by sequential ordering of samples of m(t), h(t) and v(t), respectively. The matrix A is formed by the samples of the autocorrelation sequence a(t).

The signal constraints utilized in the POCS deconvolution method of the present invention include an amplitude constraint, a support constraint, and a real-valuedness constraint, with each constraint being modified for use with DS-CDMA signals. For a detailed discussion of these constraints, reference may be made to a paper by Z. Kostic, I. Sezan, and E. Titlebaum entitled *Estimation of the Parameters of a Multipath Channel Using Set-Theoretic Deconvolution*, 40 IEEE Trans. Communications 1006-112 (June 1992), which is expressly incorporated herein by reference. A crucial, additional constraint for successful deconvolution in accordance with the present invention is based on the variance of the signal residual and related to the noise covariance. This modified noise covariance constraint is described in detail below.

Given the constraint sets and their respective projection operators, the POCS algorithm-based estimate of the channel $\hat{h}$ is expressed by $$\hat{h}_{j+1} P_v P_s P_{re} P_b \hat{h}_j; \; j=0,1$$

where $\hat{h}_0$ is an arbitrary initialization (e.g., $\hat{h}_0 = m(t)$) and $\hat{h}_j$ denotes the channel estimate for components $h_1$ through $h_k$, obtained at the j-th iteration of the algorithm. $P_v$ denotes projection onto the residual covariance constraint set, $P_s$ denotes projection onto the signal support constraint, $P_{re}$ denotes the signal "realness" constraint, and $P_b$ denotes the magnitude bound constraint. The derivation of the latter three constraints is described in detail in *Estimation of the Parameters of a Multipath Channel Using Set-Theoretic Deconvolution* which is referenced above and incorporated by reference herein. Suffice it to say that provided the constraint sets have a non-empty intersection, the algorithm is guaranteed to converge to a member of the intersection set $C_o = C_v \cap C_s \cap C_{re} \cap C_b$ where $C_v$, $C_s$, $C_{re}$ and $C_b$ represent individual constraint sets. In practice, iterations are performed until no significant improvement from iteration to iteration is achieved. When such a state is obtained, the estimate of the channel is given by the last hi. Reasonable results have been achieved experimentally prior to the fifth iteration.

5. Example Illustrating The Derivation Of Projection Onto A Constraint Set

A modified residual covariant constraint based on the statistics of the noise of a matched filter and utilized in accordance with the present invention for POCS-based channel estimation will now be described in detail. Initially, it should be noted that the residual associated with an estimate $\hat{h}$ is defined as $g(\hat{h}) = m - A\hat{h}$. It is desirable that $\|g(\hat{h})\|$ does not exceed $\|g(h)\|$, the norm of the residual associated with the actual solution. Note that $\|g(h)\|$ is closely related to the noise variance $\sigma_v^2$.

A. Constraint Set

Noise at the input of the matched filter is assumed to be White Gaussian Noise (WGN). At the output of the matched filter, noise is no longer white. The development of a constraint set based on noise covariance in accordance with the inventive technique of the present invention thus relies on a confidence interval computed via the $\chi^2$ statistic, which statistic applies to the sum of independent Gaussian random variables. The components of the residual $m - A\hat{h}$ that results in the $\chi^2$ statistic is given by:

$$\|g(f)\|_{R_v^{-1}}^2 = (m - Af)^T R_v^{-1}(m - Af).$$

Here, $R_v$ are the covariance matrix of the noise samples, and is expressed as $R_v = \sigma_n^2 S * S^T$. The definition of the residual convex set is given as $$C_v = \{f : \|g(f)\|_{R_v^{-1}}^2 = (m - Af)^T R_v^{-1}(m - Af) \leq B_v\}.$$

The set can also be written as $$C_v = \left\{ f : \|g(f)\|^2 = \sum_{i=1}^{K} |m(i) - [Af](i)|^2 \leq B_v \right\},$$

where m(i) and [Af](i) denote the ith component of the vectors m and Af. The bound $B_v$ is determined from the noise variance as $$B_v = (\gamma \sqrt{2K} + K) \sigma_v^2$$

where the constant $\gamma$ reflects the confidence with which the ideal solution is a member of this set. The variance of the channel noise $\sigma_v^2$ can be estimated via a priori measurements. In the illustrative rake receiver 10 depicted in FIG. 1, for example, these measurements are performed by noise estimating module 17.

The projection $P_v y$ of an arbitrary y onto $y_p$ which lies on the boundary of set $C_v$ can be found by minimizing $S^T S$ subject to $(m - Ay_p)^T R_v^{-1}(m - Ay_p) = B_v$, where $s = y_p - y$. The Lagrangian equation can be written as $$\frac{\partial}{\partial_s} \{s^T s + \lambda[(m - A(y+s))^T R_v^{-1}(m - A(y+s)) - B_v]\} = 0.$$

The derivative is equal to $$2s + \lambda[-A^T R_v^{-1} m - (m^T R_v^{-1} A)^T + ((Ay)^T R_v^{-1} A)^T + A^T R_v^{-1} Ay + 2A^T R_v^{-1} As] = 0.$$

Since one can show that $$(I + \lambda A^T R_v^{-1} A)s = \lambda(A^T R_v^{-1} m - A^T R_v^{-1} Ay),$$

the expression for projection is $$y_p = y + s = y + \left(\frac{1}{\lambda} I + A^T R_v^{-1} A\right)^{-1} A^T R_v^{-1}(m - Ay).$$

The constraint equation $(m - Ay_p)^T R_v^{-1}(m - Ay_p) = B_v$ in which $y_p$ is replaced by the previous expression determines the value of the Lagrange multiplier. It can also be shown that $$(m - Ay)^T \left\{ R_v^{-1} - 2R_v^{-1} A \left(\frac{1}{\lambda} I + A^T R_v^{-1} A\right)^{-1} A^T R_v^{-1} + R_v^{-1} A^T \left(\frac{1}{\lambda} I + A^T R_v^{-1} A\right)^{-2} A^T R_v^{-1} A A^T R_v^{-1} \right\} (m - Ay) = B_v.$$

The matrices involved are Hermitian, and for the purpose of efficient computation, they can be approximated by circular matrices. That makes feasible the diagonalization of all the matrices by discrete Fourier transform. From there, scalar equations can be written in the frequency domain, i.e.

$$(m - Ay_p)^T R_v^{-1}(m - AY_p) =$$

$$\frac{1}{N} \sum_{k=0}^{N-1} |g_o(k)|^2 \left[ R_v^{-1}(k) - \frac{2R_v^{-2}(k) |A(k)|^2}{R_v^{-1}(k) |A(k)|^2 + 1/\lambda} + \frac{R_v^{-3}(k) |A(k)|^4}{[R_v^{-1}(k) |A(k)|^2 + 1/\lambda]^2} \right] = \frac{1}{N} \sum_{k=0}^{N-1} |g_o(k)|^2 \frac{R_v^{-1}(k)}{(\lambda R_v^{-1}(k) |A(k)|^2 + 1)^2}$$

An optimal value of $\lambda$ may then be computed for subsequent use in computing the projection onto the set.

6. Simulation Results

Figure 2:
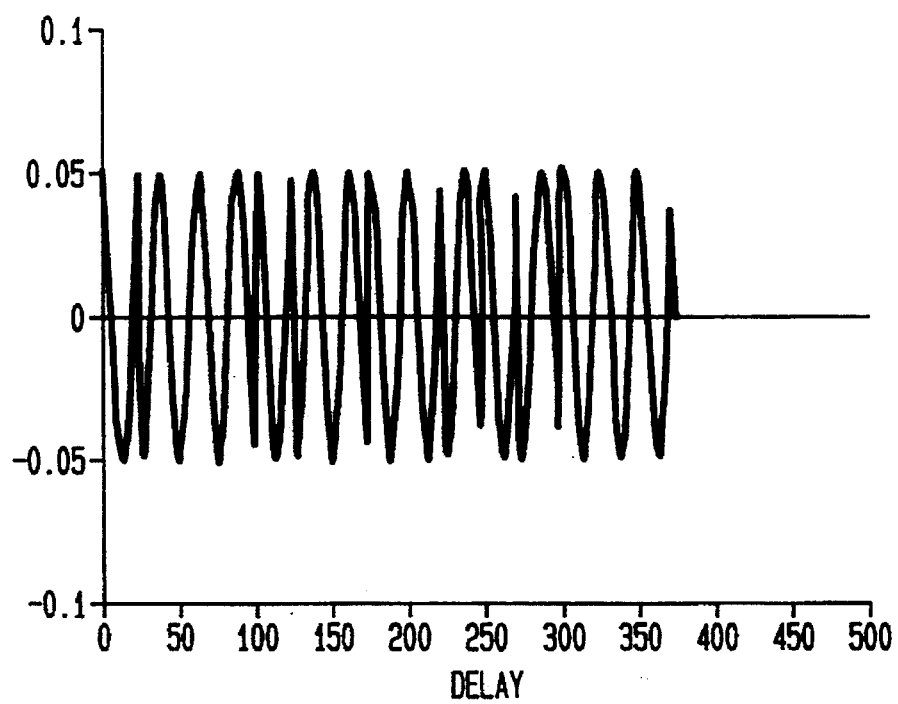
FIG. 2 is a graphical representation of an example of a DS-CDMA probing signal with BPSK modulation used for evaluating the performance of the proposed receiver for specular multipath channels in accordance with the POCS deconvolution technique of the present invention.
Figure 3:
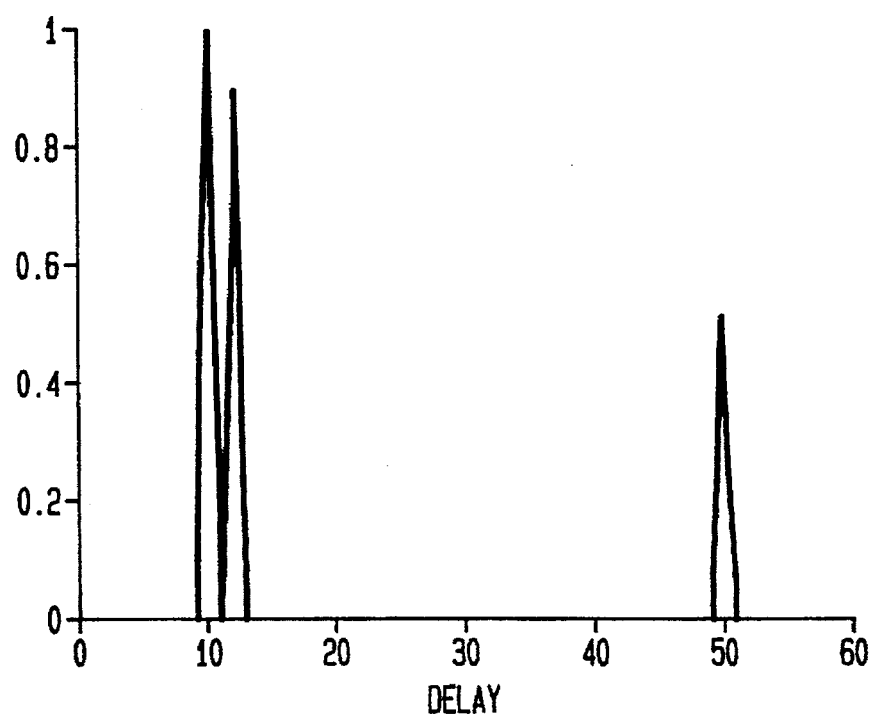
FIG. 3 is a graphical representation of a simulated three-component multipath channel.

The application of the POCS deconvolution technique to be utilized by the channel estimator in accordance with the present invention was evaluated experimentally using probing signals, with discrete time-radian bandwidth products in the range of 200 to 500, with a bandwidth of 1, to simulate specular multipath channels and DS-CDMA signals. The evaluation was performed for SNR levels in the range from 5 dB to 40 dB. The probing signal, which was BPSK modulated on a carrier and based on an m-sequence of length 15 (with a chip-length of 25 samples), is illustrated in FIG. 2. The simulated channel depicted in FIG. 3 is a three-component multipath channel represented by I={(10, 1.0)(12,0.9)(50,0.5)} where each respective ordered pair represents a corresponding one of the closely spaced path components, the first number of each ordered pair representing the time delay and the second representing the attenuation factor. It will be apparent to those skilled in the art that two of the closely spaced path components have similar attenuation factors.

Figure 4:
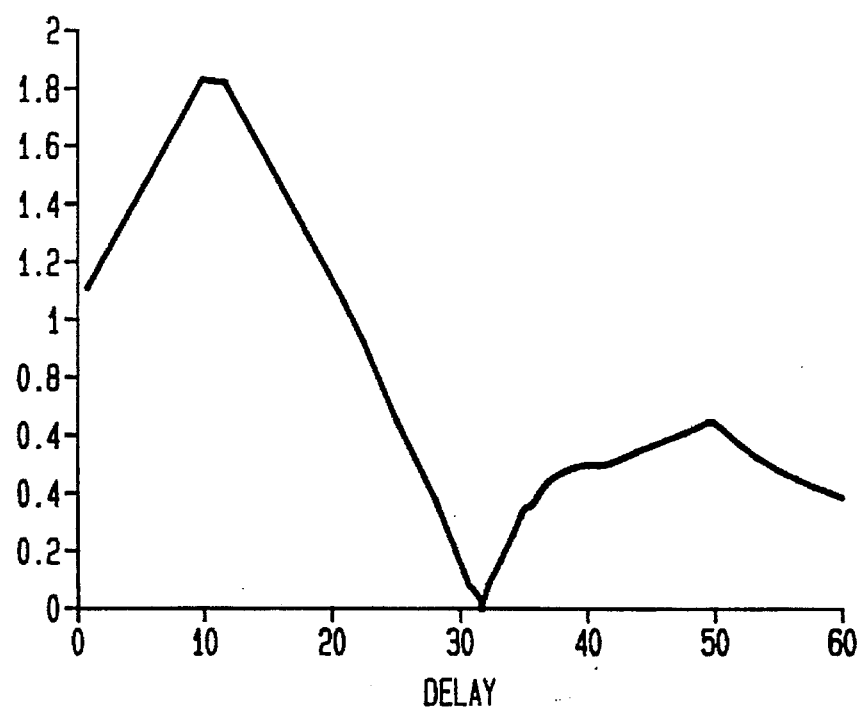
FIG. 4 represents the output of a traditional matched filter matched to the probing signal waveform for the simulated channel of FIG. 3 whose output is traditionally used as a correlation-based channel estimator to generate rake receiver coefficients.
Figure 5:
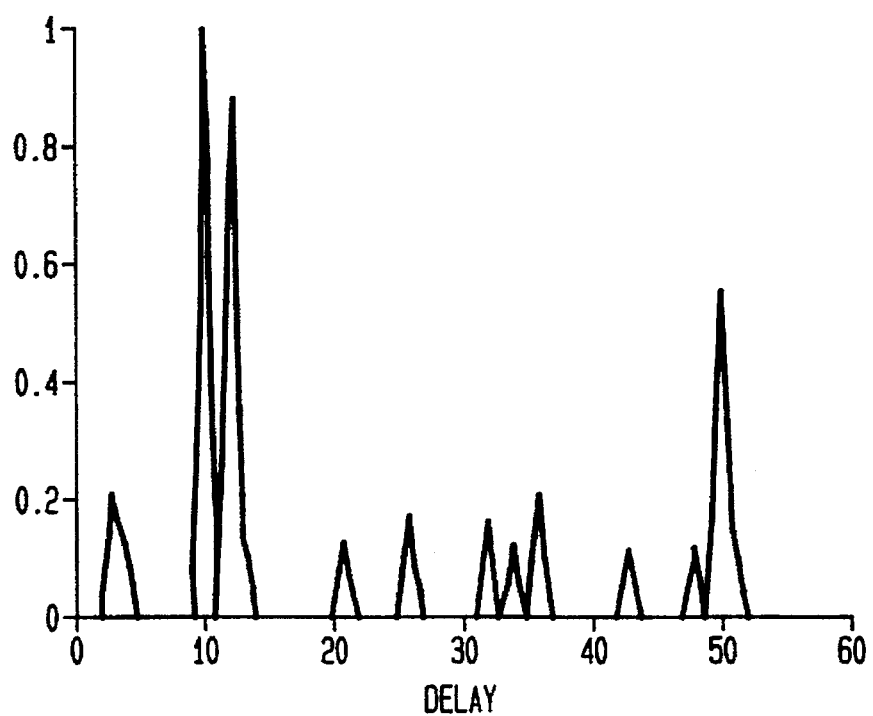
FIG. 5 is a graphical plot illustrating the estimated multipath channel obtained by employing POCS-based deconvolution after matched filtering in accordance with the present invention; this channel estimate (which is considerably better than one from FIG. 4) is used to generate rake receiver coefficients for the inventive method.

FIG. 4 represents the output of the matched filter for channel I and length m-sequence for SNR=5 dB. The result of the proposed POCS-based deconvolution after matched filtering is shown in FIG. 5. As seen in FIG. 5, even multipath components spaced apart by a single sample interval (1/25th of a sequence chip) are well resolved.

As will be readily appreciated by those skilled in the art, a rake receiver implementing a POCS-based channel estimation technique in accordance with the present invention has several advantages over conventional receiver structures. For example, it exploits the probing signal structure and thus permits the use of probing signals of smaller bandwidth to achieve high resolution in separating closely spaced multipath components, which would (in the absence of the inventive method) require probing signals of much larger bandwidth. Moreover, the rake receiver structure performs reliably even with low power, transmitted DS-CDMA signals.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

What is claimed is:

1. A spread spectrum receiver for use in a direct sequence, code division multiple access (DS-CDMA) communication system in which a given CDMA signature sequence is assigned to said receiver and to a source synchronized with the receiver and wherein the system has a predetermined symbol transmission rate $1/T_b$, a processing gain, and a corresponding chip rate $1T_c$ determined by the processing gain and symbol transmission rate, said receiver comprising:

means for sampling an incoming analog signal including a transmitted symbol and propagating in said DS-CDMA system to thereby produce an incoming sampled signal, said incoming analog signal having a plurality of both main and multipath return signals of varying signal strengths;

a tapped delay line for receiving said incoming sampled signal and having a plurality of taps for producing a set of sampled outputs produced by said sampling means, said delay line having a number of taps that exceeds $T_b/T_c$;

a pseudo-noise code generator for generation an apropriate pseudo-noise waveform for multiplication with each sampled output; and demodulating means for demodulating said incoming sampled signal to generate a detected symbol which estimates the transmitted symbol.

2. The receiver of claim 1, wherein said sampling means provides more than one sample per chip.

3. In a direct sequence, code division multiple access (DS-CDMA) communication system with a receiver for receiving a received signal having a given CDMA signature sequence, wherein the signature sequence is also assigned to a corresponding source synchronized with the receiver and wherein the system has a predetermined processing gain and a corresponding chip rate $1/T_c$ determined by the processing gain and a symbol transmission rate:

means using the received signal for estimating a plurality of coefficients representative of an estimate of a multipath communication channel; and a matched filter matched to characteristics of the multipath communication channel in accordance with said plural coefficients estimated by said estimating means, wherein said matched filter includes a plurality of delay elements for receiving the received signal and each of the delay elements providing a delay of $T_{sc}$, wherein $T_{sc}$ is less than $T_c$, and a pseudo-noise code generator for generating an appropriate pseudo-noise waveform for multiplication with output of each of the plurality of delay elements.

4. The receiver of claim 3, wherein said estimating means comprises a noise variance estimator filter matched to a transmitted sequence waveform and deconvolving means responsive to the noise variance estimator filter, said estimating means being operative to perform projection onto convex sets to provide estimates of said coefficients.

5. The receiver of claim 4, further comprising means for multiplying said estimated coefficients with outputs of said delay elements to thereby resolve multipath.

* * * * *